United States Patent
Durbha et al.

(10) Patent No.: US 8,516,416 B1
(45) Date of Patent: *Aug. 20, 2013

(54) INTEGRATED DATA MODEL BASED FRAMEWORK FOR DRIVING DESIGN CONVERGENCE FROM ARCHITECTURE OPTIMIZATION TO PHYSICAL DESIGN CLOSURE

(75) Inventors: Ananth Durbha, San Jose, CA (US); Satish Padmanabhan, Sunnyvale, CA (US); Plus Ng, Hillsboro, OR (US)

(73) Assignee: Algotochip Corp., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/603,421

(22) Filed: Sep. 5, 2012

(51) Int. Cl.
 *G06F 17/50* (2006.01)
(52) U.S. Cl.
 USPC ............................ 716/104; 716/102; 716/106

(58) Field of Classification Search
 USPC .................... 716/102, 104, 106; 712/22, 34, 712/236
 See application file for complete search history.

(56) References Cited

U.S. PATENT DOCUMENTS

| | | | | |
|---|---|---|---|---|
| 5,870,308 | A  * | 2/1999 | Dangelo et al. | 716/104 |
| 6,408,428 | B1 * | 6/2002 | Schlansker et al. | 716/104 |
| 2005/0204316 | A1 * | 9/2005 | Nebel et al. | 716/2 |

* cited by examiner

*Primary Examiner* — Nha Nguyen
*Assistant Examiner* — Brian Ngo
(74) *Attorney, Agent, or Firm* — Tran & Associates

(57) ABSTRACT

Systems and methods are disclosed to automatically synthesize a custom integrated circuit by encoding architecture level knowledge in a data model to generate and pass new constraints for physical synthesis of a chip specification uniquely customized to computer readable code. The system receives a look-ahead cost function during architecture optimization consistent with cost observed later in the flow after detailed physical synthesis is performed. The look-ahead cost function is generated from a prior iteration and supplied to a subsequent iteration through the data model.

19 Claims, 8 Drawing Sheets

---

Receiving a specification of the custom integrated circuit including computer readable code and one or more constraints on the custom integrated circuit (702)

Encoding architecture level knowledge in a data model to generate and pass new constraints for physical synthesis of a chip specification uniquely customized to the computer readable code (704)

Receiving a look-ahead cost function during architecture optimization consistent with cost observed later in the flow after detailed physical synthesis is performed, wherein the look-ahead cost function is generated from a prior iteration and supplied to a subsequent iteration through the data model (706)

Automatically translating information available at one optimization point into a constraint for another optimization point invoked at a different place in the design flow using the data model (708)

Synthesizing a computer readable description of the chip specification into the custom integrated circuit for semiconductor fabrication (710)

| Receiving a specification of the custom integrated circuit including computer readable code and one or more constraints on the custom integrated circuit (702) |
|---|
| Encoding architecture level knowledge in a data model to generate and pass new constraints for physical synthesis of a chip specification uniquely customized to the computer readable code (704) |
| Receiving a look-ahead cost function during architecture optimization consistent with cost observed later in the flow after detailed physical synthesis is performed, wherein the look-ahead cost function is generated from a prior iteration and supplied to a subsequent iteration through the data model (706) |
| Automatically translating information available at one optimization point into a constraint for another optimization point invoked at a different place in the design flow using the data model (708) |
| Synthesizing a computer readable description of the chip specification into the custom integrated circuit for semiconductor fabrication (710) |

FIG. 7

INTEGRATED DATA MODEL BASED FRAMEWORK FOR DRIVING DESIGN CONVERGENCE FROM ARCHITECTURE OPTIMIZATION TO PHYSICAL DESIGN CLOSURE

This application claims priority to U.S. application Ser. No. 12/906,785, the content of which is incorporated by reference.

BACKGROUND

The present invention relates to a framework for EDA design convergence.

FIG. 1 shows a high level view of a typical SoC design flow. In a conventional system on a chip (SoC) process, a design specification 1 is processed by an architecture/microarchitecture design optimization block 40. The result of the block 40 is a behavioral register transfer language (RTL) 150 which is received by a netlist synthesis block 50. A gate level netlist 160 is generated, from which a physical synthesis block 60 can use to generate a full chip layout. The layout can be analyzed by a full chip analysis block 70. Delay dependency updates can be provided as feedback to the architecture/microarchitecture design optimization block 40. Additionally, critical delay information can be provided to the netlist synthesis module 50. Typically, the process requires the complete design to be accomplished over multiple specialized optimization blocks 40, 50, and 60. Even a single specialized optimization is accomplished as an iterative incremental refinement (for example iterations 100 or 110 or 120) since most of these optimization problems cannot be easily formulated and solved as a pure closed-form analytical equation. Even though each optimization flow works independent of other optimization flows, the modified designs could impact the performance of other optimization flows. Thus when entire design is put together, systemic sub-optimality is discovered and many of the optimization flows may need to be re-run (for example iterations 130 or 140) with some additional constraints or modifications to cost functions. Many times these additional constraints or modifications could uncover newer issues while solving older issues. Thus design closure is a significant risk.

One risk to design closure comes from the fact that earlier optimization flows like architecture optimization block 40 is performed on more abstract design model than later optimization flows like physical design optimization block 60. Many optimization decisions made in earlier part of the design cycle may not be consistent with details included in the latter part of the flow. Such inconsistencies may mask real critical paths, causing optimization engines to focus more aggressively on lesser critical paths, leading to a situation where fixing real critical paths later is much harder, if not impossible. In fact, these poorly directed initial optimizations may have to be identified and unwound as well to eliminate false critical paths.

Another risk to design closure comes from adopting hierarchical design methods in an effort to deal with tool capacity (memory and turn-around time) limitations. These design methods avoid having to analyze/design full circuit paths end-to-end in one-go. This piece-meal approach could potentially elude design convergence as designers and tools dance between different aspects of the same circuit at different times.

Yet another risk to design closure comes from inadequate constraints being specified on optimizations. In the current design environment setting up appropriate constraints on different optimization flows is largely manual step requiring an expert knowledge. In terms of convergence rate and quality, it is desirable to set the maximum possible valid constraining conditions on the optimization flows. It is very time consuming and error prone to determine these constraints manually. The opportunity for greater automation of constraint generation exists, but the challenge lies in the fact that as design flows move from one tool to another, there is no continuity in the data model and hence necessary information may not be available in one convenient place. For example, physical synthesis may try to optimize logic placement based on number of signals they share. On the other hand, architecture optimization flow is aware of some signals that may be more likely to be activated than others and hence knows that such signals should be given greater weight than physical synthesis would normally do. In order to accomplish this, it would be necessary to set some constraints such as relative grouping of underlying hardware blocks. The AO does not know how to set placement constraints. Physical synthesis does not know the dynamic signal priority. Thus there is discontinuity in the underlying data model.

SUMMARY

Systems and methods are disclosed to automatically synthesize a custom integrated circuit by receiving a specification of the custom integrated circuit including computer readable code and one or more constraints on the custom integrated circuit; encoding architecture level knowledge in a data model to generate and pass new constraints for physical synthesis of a chip specification uniquely customized to the computer readable code; receiving a look-ahead cost function during architecture optimization consistent with cost observed later in the flow after detailed physical synthesis is performed, wherein the look-ahead cost function is generated from a prior iteration and supplied to a subsequent iteration through the data model; automatically translating information available at one optimization point into a constraint for another optimization point invoked at a different place in the design flow using the data model; and synthesizing a computer readable description of the chip specification into the custom integrated circuit for semiconductor fabrication.

Implementation of the above aspect may include one or more of the following. The system can apply pre and post fix tags to indicate if the grouping of cells in a hierarchy is a hard or soft constraint. Names can be stored with certain pre/post fix to indicate a critical path from the architecture level knowledge. The system can indicate placement constraints for optimal timing with one of: macro blocks name, hierarchy name, pragma, comment, dummy module, wrapper module. The system can perform look ahead to detect critical paths using information captured in the prior iteration or supplied by the user. The constraint can be one of: register transfer language (RTL) constraint, floor plan constraint, physical constraint, timing constraint, power constraint, system level constraint. Constraint information can be provided to the data model through a netlist naming protocol, among others.

Advantages of the preferred embodiments of the system may include one or more of the following. The system enables a new communication medium and protocol linking various tools across the end-to-end flow. Such a medium enables inter-tool but intra-flow communications to take place more readily. The system also enables closer fidelity between physical design cost function estimation used in architecture optimization and tape-out version of physical synthesis flow. Overall the system tries to taper off size and frequency of global changes in the chip design as the design process progresses towards more detailed design phases. The framework enables flow level optimization behavior transformation leading to higher quality design convergence. It does so without requiring a re-engineering of standard EDA technologies and hence can be implemented within standard EDA tool based design environment. The system automates physical synthesis, which is the most detailed level design activity. In the initial design stages, real critical paths are masked by solvable critical paths. The system automatically determines which critical paths to optimize for and automatically unmasks real critical paths. The system uses non-hierarchical design methods and hierarchical methods which analyze the complete circuit in a single run. This global approach brings design convergence as designers and tools focus on more aspects of the same circuit at the same time than was traditionally possible. The system alleviates the problems of chip design and makes it a simple process. The embodiments shift the focus of product development process back from the hardware implementation process back to product specification and computer readable code or algorithm design. Instead of being tied down to specific hardware choices, the computer readable code or algorithm can be implemented on a processor that is optimized specifically for that application. The preferred embodiment generates an optimized processor automatically along with all the associated software tools and firmware applications. This process can be done in a matter of days instead of years as is conventional. The system is a complete shift in paradigm in the way hardware chip solutions are designed.

The instant system removes the risk and makes chip design an automatic process so that the algorithm designers themselves can directly make the hardware chip without any chip design knowledge. The primary input to the system would be the computer readable code or algorithm specification in higher-level languages like C or Matlab.

Of the many benefits, the benefits of using the system may include:
1) Scheduling: If chip design cycles become measured in weeks instead of years, the companies using The instant system can penetrate rapidly changing markets by bringing their products quickly to the market.
2) Cost: The numerous engineers that are usually needed to be employed to implement chips are made redundant. This brings about tremendous cost savings to the companies using The instant system.
3) Optimality: The chips designed using The instant system product have superior performance, Area and Power consumption.

The instant system is a complete shift in paradigm in methodology used in design of systems that have a digital chip component to it. The system is a completely automated software product that generates digital hardware from algorithms described in C/Matlab. The system uses a unique approach to the process of taking a high level language such as C or Matlab to realizable hardware chip. In a nutshell, it makes chip design a completely automated software process.

BRIEF DESCRIPTION OF THE DRAWINGS

FIG. 7 shows an exemplary method to automatically synthesize a custom integrated circuit.

DESCRIPTION

Figure 2:
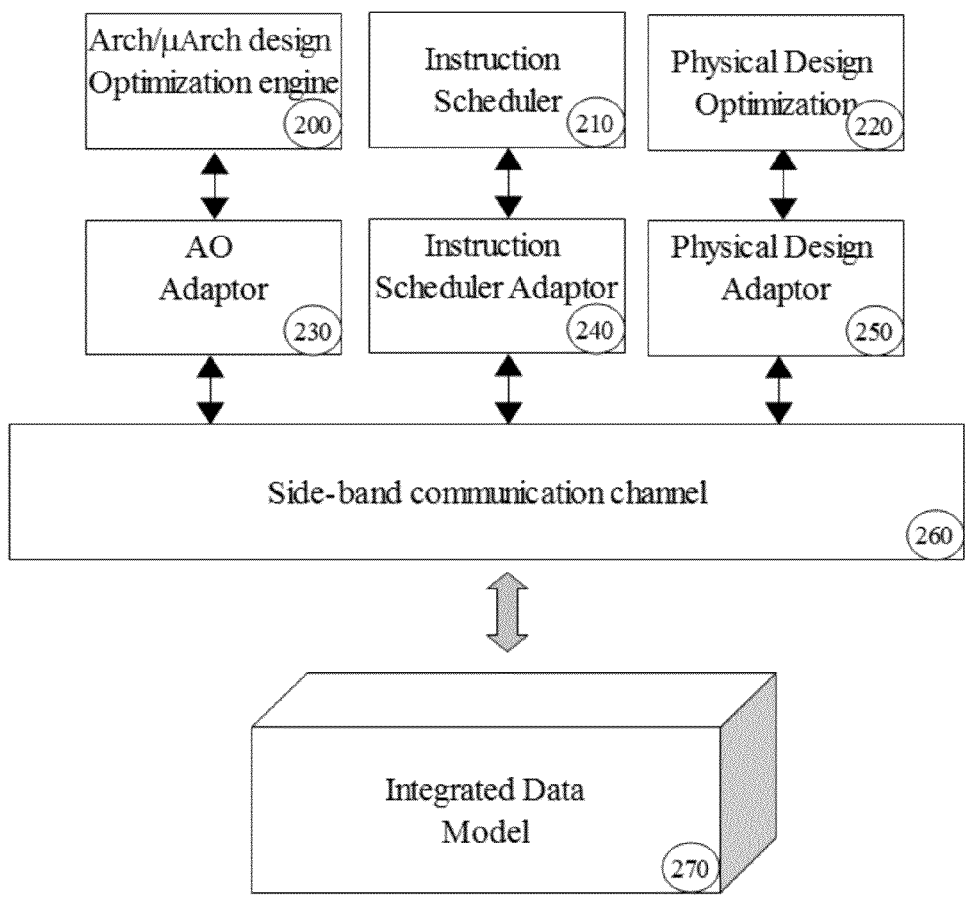
FIG. 2 shows an exemplary framework with an integrated data model (IDM) in accordance with one aspect of the invention.

Turning now to FIG. 2, a frame work with an integrated data model (IDM) 270 is used in accordance with one aspect of the invention. In FIG. 2, an architecture/microarchitecture design optimization engine 200 communicates with Architecture Optimization (AO) adapter 230. In addition, an instruction scheduler 210 can communicate with an instruction scheduler adapter 240. Similarly, a physical design optimization engine 220 communicates with a physical design adapter 250. The adapters 230, 240 and 250 communicate through a side-band communication channel 260 which in turn communicates with the integrated data model 270.

The sideband communication channel 260 enables various optimization flows to pass contextual information into a communication medium where such information is persistently but passively maintained throughout the flow. In an EDA tool based SoC design flow context, the channel 260 is implemented using a non-intrusive and non-trivial semantic extensions of existing standard format design collateral. For example, the following artifacts could be embedded into a netlist file by the integrated data model 270: (a) dummy hierarchy, (b) object name prefix and postfix tags, and dummy cells. In another example, the integrated data model 270 can insert a different artifact into a static timing report including embed paths with electrically unconnected objects as virtual path elements.

The optimization engines 200, 210 and 220 communicate with the channel 260 through adapters 230, 240 and 250. An adapter is usually a pre or post processing script that can modify the netlist or certain standard design collateral such as STA path-files using the sideband communication protocol. These scripts are written and used like any other tool flow scripts, so there are no technology dependencies for creating and/or using these adapters. The integrated data model 270 also has a built-in adapter to communicate with this sideband channel 260.

The framework enables flow level optimization behavior transformation leading to higher quality design convergence. The framework does so without requiring a re-engineering of standard EDA technologies and hence can be implemented within standard EDA tool based design environment.

Figure 3:
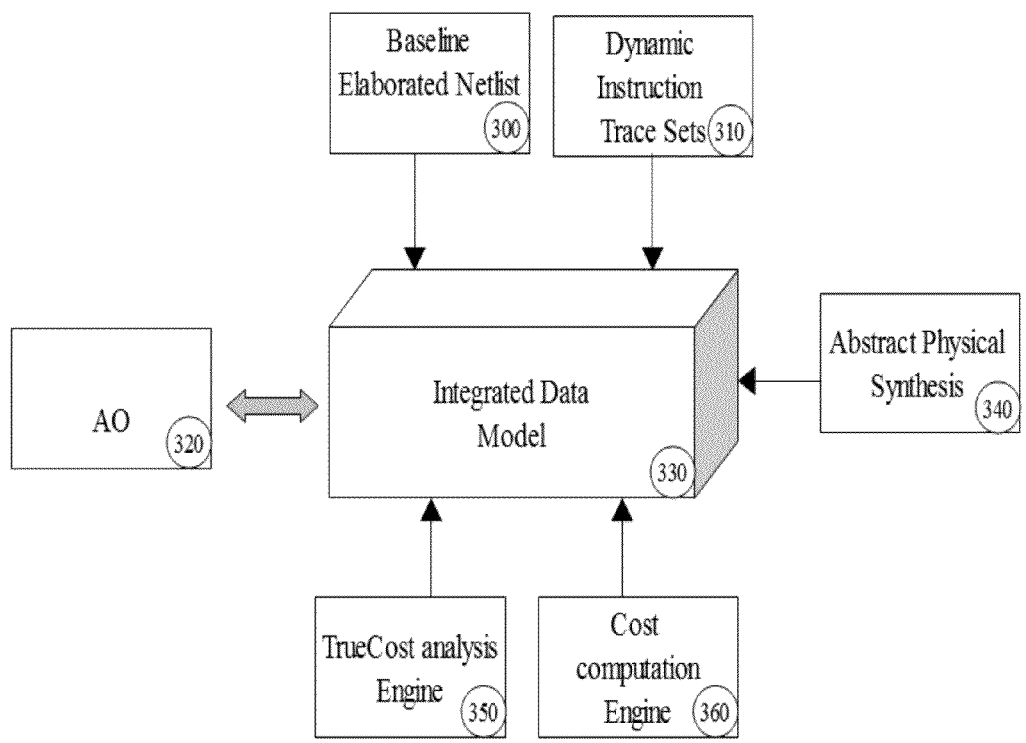
FIG. 3 shows an exemplary a system for cost function modeling.

Turning now to FIG. 3, a system for cost function modeling is shown. One aspect of the IDM frame-work is that it has a scalable cost function modeling capability. A fully elaborated netlist 300, along with various dynamic instruction traces 310 are provided to the IDM as a baseline. An AO 320 can then use the IDM for what-if analysis during optimization loops. In order to keep turn-around-time lower than traditional physical synthesis based QoR analysis, the IDM 270 uses an intelligent hierarchy management to create dynamically abstracted physical synthesis 340 design model. In order to ensure cost function model remains sensitive only to the what-if context, the system includes a TrueCost analysis engine 350. Traditional physical synthesis based QoR may not yield a response that is sensitive to just the what-if context.

The cost function modeling begins with a baseline fully elaborated netlist 300 being loaded into an internal custom graph-based data structure representation. Dynamic instruction traces 310 are used to automatically identify potential floor-planning constraints. When the AO 320 initiates a cost function evaluation query, the change list obtained from the AO 320 is examined to determine suitable physical design hierarchy for use in abstract physical synthesis 340. This step generates a model that can be used for measuring the cost.

The cost computation engine 360 is similar to standard hierarchical flow based physical design static timing analysis and power estimation flows performed on abstract physical design model. In addition to static timing analysis, the block 360 also maintains a pre-characterized analysis of various standard building blocks. For small contained changes, it can use closed form expressions to analytically determine an estimated cost function value. Depending on requested effort level, these results can be further refined.

Figure 6A:
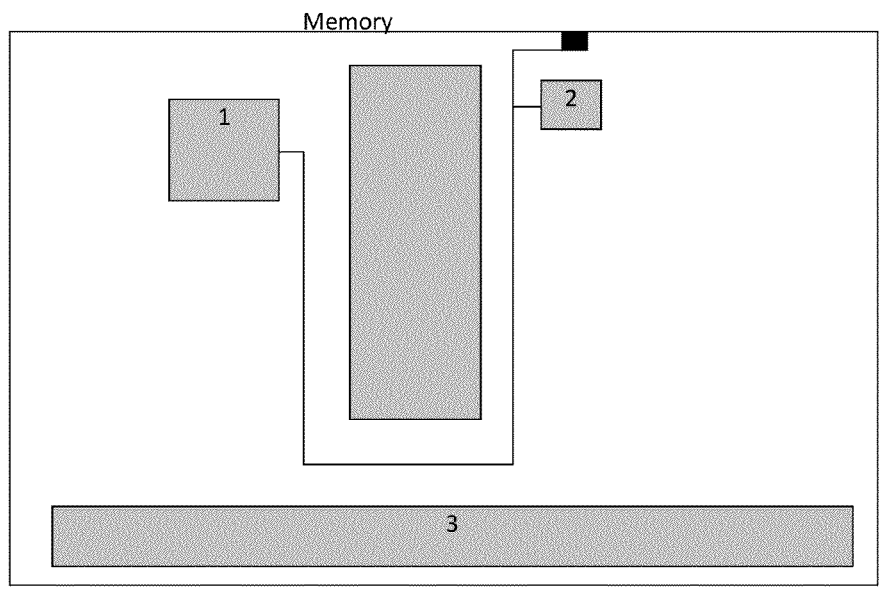
FIG. 6A shows exemplary physical design model used for cost computation
Figure 6B:
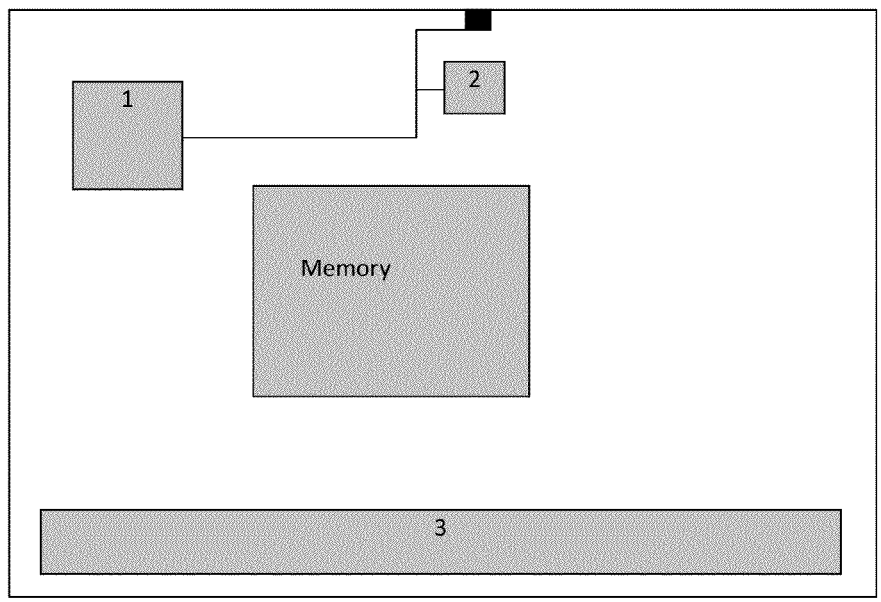
FIG. 6B shows exemplary refinement to physical design model used for TrueCost computation.

The TrueCost analysis engine (350) will analyze the STA results to determine if model was suitable for the query response. If the critical paths are not consistent with statistical inference from dynamic instruction trace profiling (310), then an attempt is made to fix such paths (goes thru standard QoR improvement steps on such paths like buffer insertion, congestion mitigation, etc). FIG. 6A shows an example of physical design model that would be used by 360. Cost computation engine (360) used abstract physical synthesis (340) to generate a layout of the design. In this case, the shape of the memory macro impacted a different network (connecting components 1, 2 and a port 3) resulting in a long interconnect which caused it to be the most critical path. When 360 analyzes this path, it will attempt to re-size or adjust the aspect ratio of memory hard macro as shown for example in FIG. 6B. The refined model provides a much more realistic cost function evaluation—enabling AO engine (320) to converge faster.

In general block 350 will perform many such model refinement steps using a rule based iterative automated process. The rules themselves are usually straightforward to implement in standard EDA flows. For example, one of the rules could be to first determine the path delay distribution profile, which is relatively straightforward to obtain from a typical STA report. The choice of next rule to apply depends on whether the distribution profile suggests the critical paths are part of a larger pattern or they are singular "outliers". An example rule to consider when there are singular outlier critical paths could be to determine whether dominant delay component is a net (wire) or gate. This too is usually quiet straightforward to obtain from STA path files.

Eventually critical paths begin to emerge which cannot be fixed any further in current netlist. The delay numbers on this model represents more closely the true cost of the what-if exercise.

Next, flow convergence using the IDM Frame-work is discussed. In a design flow, if later stage optimizations are restricted to only localized modifications then overall global convergence of the flow is under guaranteed.

Consider a situation where physical design analysis discovers power hot-spot in a region of layout. The hot-spot was caused by the fact that all circuitry in this region is being activated frequently. In the traditional design flow, physical design optimization engines will try to spread the circuit in the region to larger space, which results in shuffling layout of large parts of the circuit in order to avoid increasing overall area. This will invariably affect delays on many paths resulting in very different set of critical paths that need to be closed. The IDM framework enables another option here. It can communicate this hot-spot as a resource constraint to the instruction scheduler which may be able to find a different scheduling mechanism such that the hot spot is avoided. The main advantage of this alternate option is that, it avoids the chance of leading to physical design optimization needing to fix this is less elegant ways (i.e global changes). This concept is described in greater detail in another patent disclosure ["Architectural level power-aware optimization and risk mitigation", patent application Ser. No. 12/835,640 filed 13, Jul. 2010, Docket ALGOTOCHIP-007].

As a second example consider a situation where a physical design has many macros in addition to logic cells. It is preferable that macro placement does not over-compartmentalize the space in which standard logic needs to be placed otherwise placement optimization engines may not be able to produce good quality results. In a tradition physical design flow, macros tend to get grouped based on geometries and topology of nets connected to it. But nets are only segments of paths. Until physical synthesis flow is fully completed and static timing analysis run the path level delay impact of macro placement is not known. Because the feedback is coming at the end of physical synthesis, it gets mixed up with several other optimizations as well. Thus isolating the feedback to macro placement is a non-trivial task which is largely manually done. The IDM framework again enables a different option here. Important critical paths are known in architecture optimization phase and this information is captured in the sideband channel and IDM framework can setup relative "group" constraint on the components of such paths. This enables macro placement step in physical synthesis to quickly look-up what its path neighbors without needing to wait for STA. And good macro placement leads to physical synthesis focusing correctly on real critical paths improving the QoR accomplished in single iteration.

The first example shows a back-ward influence (i.e physical design cost function computation during AO providing feedback on how to constraint upstream optimization like Instruction Scheduler). The second example shows a forward influence (i.e AO passing pre-computed information to downstream optimization like physical synthesis. These new forms of influences have been enabled by the IDM frame-work and are this is key to direct a convergent behavior in the design flow.

Figure 1:
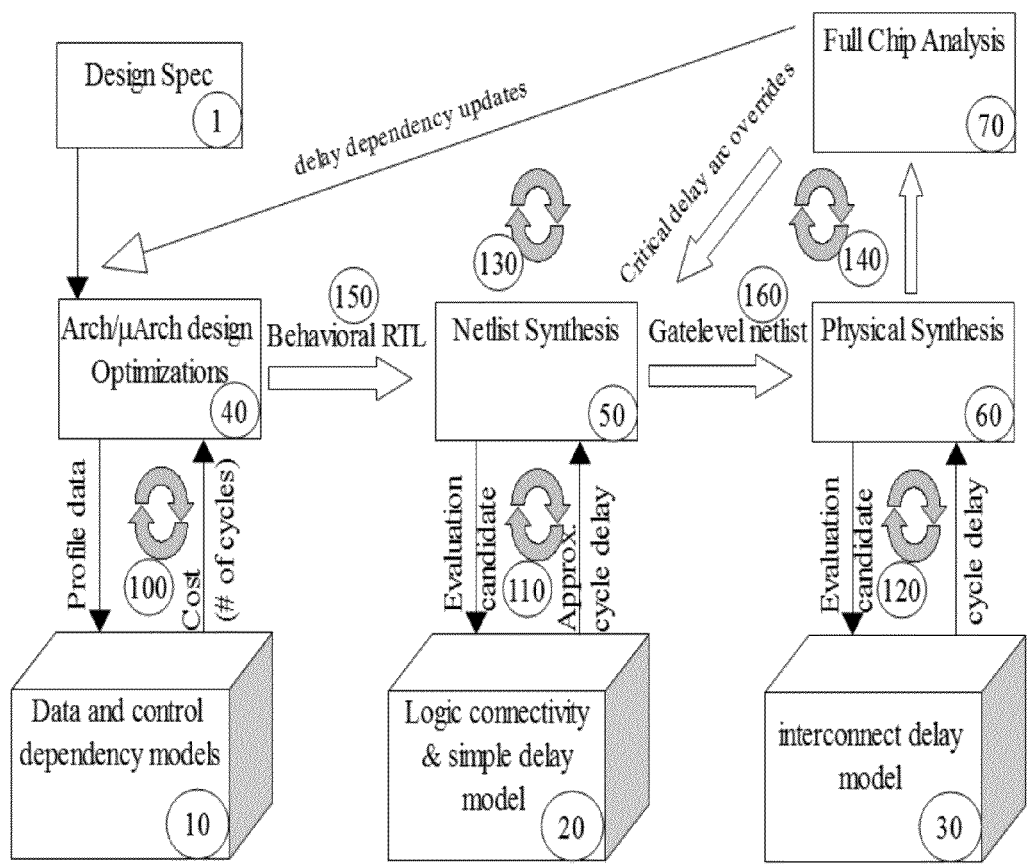
FIG. 1 shows a high level view of a typical SoC design flow.
Figure 4:
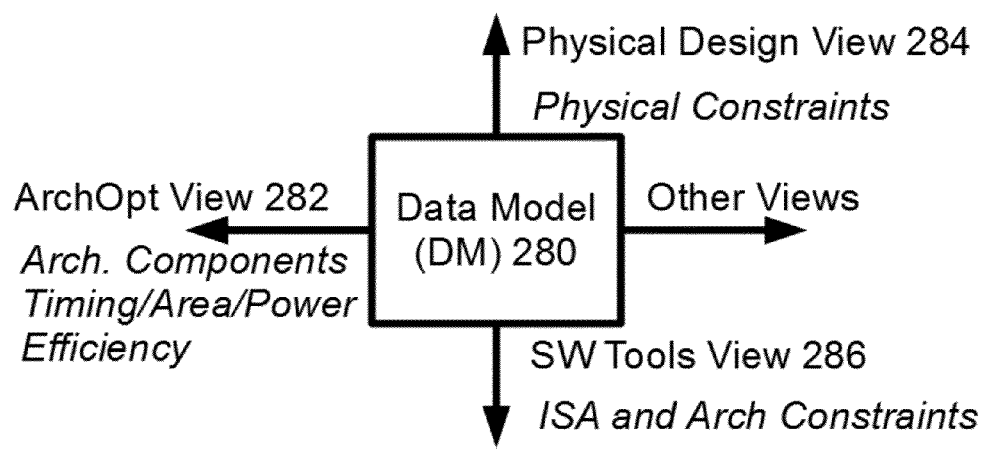
FIG. 4 shows an exemplary data model.
Figure 5A:
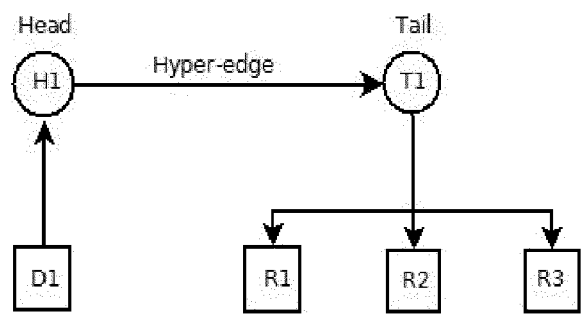
FIGS. 5A-5D show various exemplary MAML hypergraphs used to store architecture design states in accordance with one embodiment of the system.
Figure 5B:
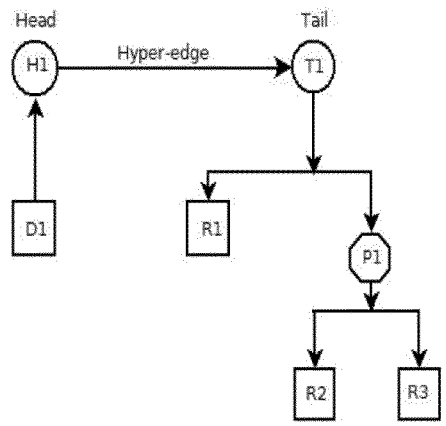
Figure 5C:
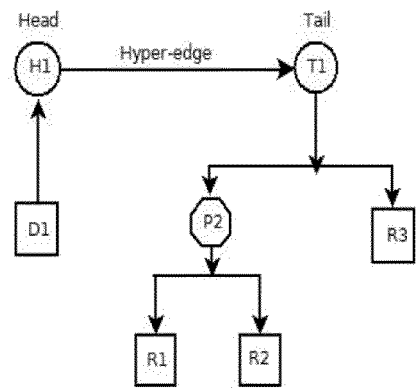
Figure 5D:
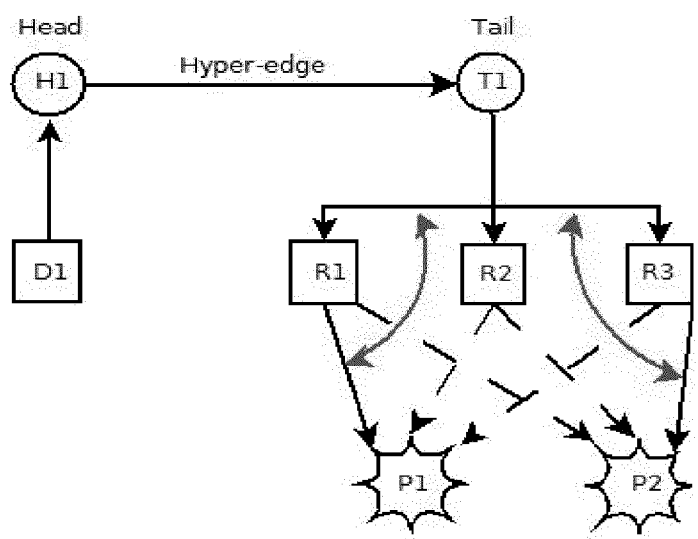

FIG. 4 shows an exemplary data model. The architecture optimizer 40 (FIG. 1) generates an intermediate hardware representation customized to the application code called System, Architecture, & Micro-Architecture (SAMA) representation which is an Abstract Unified Representation of the ASIC. A data model (DM) 280 can express the SAMA in various views of the design. SAMA acts as a transition layer between software compilation and hardware synthesis. Such a transition layer is intended to take advantage of optimizations available in the compiler tool flow, and also to provide freedom to the low-level synthesizer, to explore options for application-specific implementations. The DM 280 can be used to generate various views of an application. For example, an architecture optimizer view 282 provides architectural component information such as timing, area, power efficiency so that the optimizer can best fit the design to the constraints. A physical design view 284 can be generated which addresses physical constraints such as space/size requirements. A software tools view 286 can leverage the DM 280 to provide ISA and architectural constraints for the software to use. Other views can be generated from the DM 280 as well. The DM 280 is a repository of information generated by tools of FIG. 3 and such information is needed to ultimately generate a layout of the IC. The DM 280 can generate different views that can be queried by different tools. These views can be used during physical design The DM 280 captures information not used for synthesis, but for physical design. The process encodes an initial architecture level knowledge in the data model to pass information for physical synthesis of a chip specification uniquely customized to the computer readable code. Next, the process iteratively performs physical synthesis of the chip specification and updates the data model of the chip specification in each iteration until the constraints are satisfied. Information generated from a prior iteration is provided as feedback loops with critical path look-ahead information supplied to the next iteration through the data model. For example, the system can apply pre and post fix tags to indicate if the grouping of cells in a hierarchy is a hard or soft constraint. The system can indicate placement constraints for optimal timing with one of: macro blocks name, hierarchy name, pragma, comment, dummy module, wrapper module.

Names can be stored with certain pre/post fix to indicate a critical path from the architecture level knowledge. Thus, in one example, if during a prior pass, a sub module A needs to be placed near sub module B and C, the relationship can be denoted $A_{BC}$ and similarly B can be denoted $B_{AC}$.

At the final iteration where all constraints are met, the process synthesizes a computer readable description of the chip specification into the custom integrated circuit for semiconductor fabrication.

A What-if Incremental Cost Estimation Data Model (WICE-DM) can be used. The WICE-DM architecture consists of front-end, back-end, context management and API sections. The front-end represents fully elaborated architecture design state in a design methodology. The elaborated design is stored in a cross-referenced 'multi-aspect multi-level' (MAML) hypergraph configuration that allows very efficient customizable design abstraction model (DAM) generation. The back-end represents physical design aware what-if incremental cost estimation engine. The context management section determines the appropriate DAM that front-end must generate to drive the analysis in the back-end.

Exemplary MAML hypergraph configurations are shown in FIGS. 5A-5D. A hyper-graph is a well-known graph structure that provides interconnections to be modeled as hyperedges (i.e multiple heads and multiple tails) as opposed to single pair of nodes. The multi-level hierarchy in a hypergraph can be used in netlist partitioning during placement as well as in design verification problems. This circuit diagram can be interpreted as a drawing of a hypergraph in which four vertices (depicted as white rectangles and disks) are connected by three hyperedges drawn as trees. For example, a circuit diagram can be interpreted as a drawing of a hypergraph in which a plurality of vertices (depicted as white rectangles and disks representing components) are connected by hyperedges drawn as trees.

The hyper-graph can support multiple hierarchy aspects that support overlapping hierarchies. This enables the hypergraph to allow an efficient switch between aspects.

In one embodiment, architecture level knowledge is encoded into a netlist file in to pass information that is not normally available to physical synthesis. For example, hierarchy names may contain pre and post fix tags to indicate if the grouping of cells in that hierarchy is a hard or soft constraint. This information is useful for making more aggressive decisions in physical partitioning that result in improving tool chain capacity resulting in faster turn-around time. The names of instances may also contain certain pre/post fix to indicate if architecture level model sees this as a likely pathway for real critical path. Physical synthesis can "look-ahead" to real critical paths rather than chipping away at wrong ones until right one is discovered. This eliminates unwanted optimization (over-optimization leading to other cost increase) and save turn-around time. As another example, certain macro blocks may be named to indicate placement constraints (such as array placement, among others) that helps achieve optimal timing first time around. In addition to encoding "side-band" information to the netlist file, the flow is also able to generate design constraints (physical as well timing) that are more productive in guiding the physical synthesis than original user constraints alone can. In some cases such constraints are "implied" thru a netlist naming scheme.

During synthesis, the information is pre-processed by a pre-processor which can use the architecture knowledge encoded into the netlist file. For example, if the architecture knowledge specifies that certain blocks are to be placed near each other, the pre-processor sets up the netlist file to enforce that physical relationship as a constraint. The pre-processed netlist is then passed to existing physical synthesis tool so that the tool can run more optimally with the architectural level knowledge even though a standard physical synthesis tool is used. This particular embodiment enables to data model to work with off-the-shelf tools. Alternatively, a custom physical synthesis tool can be generated that is built from the ground to incorporate architecture level knowledge and in such tool, a reduced pre-processing operation is needed to encode architecture knowledge into the netlist file.

In one embodiment, the following exemplary pseudo-code of a physical synthesis process with critical path look-ahead is as follows:

Start→Gate level netlist
  1. Design partitioning
  2. coarse placement
  3. partition sizing and shaping
  4. top level I/O pad placement
  5. logic placement
  6. HFN buffering
  7. block I/O assignment (including feed thrus)→block floor-plan ready
  8. buffering optimization
  9. estimated STA←must meet goals, otherwise very likely design will not converge.
  10. block level budget creation→block SDC ready
  11. {blocks}
  1. start→block floor-plan with block I/O fixed
  2. perform detailed placement optimization
  3. perform detailed clock tree synthesis and optimization
  4. perform detailed routing optimization
  5. block level STA←must meet local goals to fix current timing issues.
  12. top level assembly
  1. start→detailed placement optimization of top level netlist
  2. detailed clock optimization of top level netlist
  3. detailed route optimization of top level netlist
  13. detailed parasitic extraction
  14. full chip STA←must meet goals to go to tape-out
  15. chip finishing tasks—metal fill etc.
end→GDSII layout A gate level netlist is the input to the process. The process has two loops. In loop 1, steps 1 thru 9 are usually iterated many times to reach a target goal for step 9. In loop 2, steps 11.1 thru 11.5 are also repeated many times for each block and may require re-doing loop 1 if budgets in step 10 are discovered to be non-converging. Step 14 could fail because estimated STA in step 9 was inconsistent with additional realities.

In one embodiment, a fast incremental physical delay estimation model for micro-architecture optimization loop can be generated as follows. First, the process identifies a predetermined partitioning scheme and converts RTL into coarse gate level netlist (from ADM). The major components are black-boxed, and the interfaces are abstracted into fewer nets. The process determines simple pre-determined route shapes—which are easy for fast timing calculation. A timing graph is specifically designed for sensitivity analysis. The timer uses an elmore delay estimation and provides best, average and worst case "flight" time between every major block (modeled as black-box). The model allows incremental queries and is several orders of magnitude faster than STA tools. The speed is used to provide incremental cost feedback—not tape-out quality of result (QoR) measurement.

In one exemplary design, an algorithm requires 500M MAC operations/cycle. With the process, an Initial Architecture is generated with an estimated clock speed of about 250 MHz on 180 nm TSMC process node. The initial hardware is designed for 2 MAC units to achieve required throughput. However, after gate level synthesis, the achievable clock frequency is reduced to 200 MHz and the information is updated in the DM 280. After back-end flow (step 14 above), the achievable clock frequency further reduced to <165 MHz and the DM 280 is updated with the information. Since program pieces and the multiple processing units come in a range of sizes, a fair number of combinations are possible, requiring different optimizing approaches. The architecture optimizer first identifies potential parallel units in the program then performs dependency analysis on them to find those segments which are independent of each other and can be executed concurrently. The system revisits the architecture decision and now the hardware is re-designed for 3 MAC units. The new design iteratively loops through the backend flow again to see design goals are met.

The system alleviates the problems of chip design and makes it a simple process. The embodiments shift the focus of product development process back from the hardware implementation process back to product specification and computer readable code or algorithm design. Instead of being tied down to specific hardware choices, the computer readable code or algorithm can always be implemented on a processor that is optimized specifically for that application. The preferred embodiment generates an optimized processor automatically along with all the associated software tools and firmware applications. This process can be done in a matter of days instead of years as is conventional. The system is a complete shift in paradigm in the way hardware chip solutions are designed. Of the many benefits, the three benefits of using the preferred embodiment of the system include 1) Schedule: If chip design cycles become measured in weeks instead of years, the user can penetrate rapidly changing markets by bringing products quickly to the market; and
2) Cost: The numerous engineers that are usually needed to be employed to implement chips are made redundant. This brings about tremendous cost savings to the companies using system.
3) Optimality: The chips designed using The instant system product have superior performance, Area and Power consumption.

FIG. 7 shows an exemplary method to automatically synthesize a custom integrated circuit. This method includes receiving a specification of the custom integrated circuit including computer readable code and one or more constraints on the custom integrated circuit (702); encoding architecture level knowledge in a data model to generate and pass new constraints for physical synthesis of a chip specification uniquely customized to the computer readable code (704); receiving a look-ahead cost function during architecture optimization consistent with cost observed later in the flow after detailed physical synthesis is performed, wherein the look-ahead cost function is generated from a prior iteration and supplied to a subsequent iteration through the data model (706); automatically translating information available at one optimization point into a constraint for another optimization point invoked at a different place in the design flow using the data model (708); and synthesizing a computer readable description of the chip specification into the custom integrated circuit for semiconductor fabrication (710).

By way of example, a computer to support the automated chip design system is discussed next. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:
1. A method to automatically synthesize a custom integrated circuit, comprising:
receiving a specification of the custom integrated circuit including computer readable code and one or more constraints on the custom integrated circuit;

encoding architecture level knowledge in a data model to generate and pass new constraints for physical synthesis of a chip specification uniquely customized to the computer readable code;

iteratively generating a custom architecture unique to the computer readable code;

receiving a look-ahead cost function during architecture optimization consistent with cost observed later in the flow after detailed physical synthesis is performed, wherein the look-ahead cost function is generated from a prior iteration and supplied to a subsequent iteration through the data model;

automatically translating information available at one optimization point into a constraint for another optimization point invoked at a different place in the design flow using the data model;

applying pre and post fix tags to indicate if the grouping of cells in a hierarchy is a hard or soft constraint synthesizing a computer readable description of the chip specification into the custom integrated circuit for semiconductor fabrication; and performing iteratively physical synthesis of the chip specification and updates the data model of the chip specification in each iteration until the constraints are satisfied, wherein the information generated from a prior iteration is provide as feedback loops.

2. The method of claim 1, further comprising creating an intra-flow inter-OE (optimization engine) sideband communication channel.

3. The method of claim 1, further comprising storing names of with certain pre/post fix to indicate a critical path from the architecture level knowledge.

4. The method of claim 1, further comprising indicating placement constraints for optimal timing with one of: macro blocks name, hierarchy name, pragma, comment, dummy module, wrapper module.

5. The method of claim 1, further comprising performing look ahead to detect true critical paths as part of cost function evaluation during optimization candidate search.

6. The method of claim 1, wherein the constraint comprises one of: register transfer language (RTL) constraint, floor plan constraint, physical constraint, timing constraint, power constraint, system level constraint.

7. The method of claim 1, further comprising providing constraint information to the data model through a netlist naming protocol.

8. The method of claim 1, further comprising performing static profiling or dynamic profiling of the computer readable code.

9. The method of claim 1, whereby static profiling or dynamic profiling of the computer readable code is converted into resource constraints for cost modeling as well as physical design optimization.

10. The method of claim 1, further comprising automatically generating firmware or software development kit (SDK) for the custom integrated circuit to run the computer readable code.

11. The method of claim 1, comprising selecting an architecture based on the computer readable code.

12. The method of claim 1, further comprising optimizing the architecture based on static and dynamic profiling of the computer readable code.

13. The method of claim 1, further comprising compiling the computer readable code into assembly code.

14. The method of claim 12, further comprising linking the assembly code to generate firmware for the selected architecture.

15. The method of claim 12, further comprising performing cycle accurate simulation of the firmware.

16. The method of claim 12, further comprising performing dynamic profiling of the firmware.

17. The method of claim 15, further comprising optimizing the architecture based on profiled firmware.

18. The method of claim 12, further comprising optimizing the architecture based on the assembly code.

19. The method of claim 1, further comprising generating register transfer level (RTL) code for the selected architecture and synthesizing the RTL code.

* * * * *